United States Patent [19]
Butler et al.

[11] 3,989,862
[45] Nov. 2, 1976

[54] METHOD AND APPARATUS FOR VAPOR-DEPOSITING COATINGS ON SUBSTRATES

[75] Inventors: John Francis Butler, Bethel Park; William John Babyak, Pittsburgh, both of Pa.

[73] Assignee: Jones & Laughlin Steel Corporation, Pittsburgh, Pa.

[22] Filed: July 15, 1974

[21] Appl. No.: 488,373

Related U.S. Application Data

[63] Continuation of Ser. No. 80,305, Oct. 13, 1970, abandoned.

[52] U.S. Cl. ............................ 427/251; 118/49; 118/49.1; 118/50; 427/424; 427/427
[51] Int. Cl.² ............... C23C 11/00; C23C 13/00
[58] Field of Search ............ 117/107.1, 71 M; 118/49, 49.1, 50; 427/250, 251, 252, 424, 427

[56] References Cited

UNITED STATES PATENTS

| | | | |
|---|---|---|---|
| 2,426,377 | 8/1947 | Smith | 117/107.1 |
| 2,590,557 | 3/1952 | Melsheimer | 117/107.1 |
| 2,665,225 | 1/1954 | Godley | 117/107.1 |
| 2,898,241 | 8/1959 | Charlton et al. | 117/107.1 |
| 3,183,563 | 5/1965 | Smith | 117/107.1 |
| 3,205,086 | 9/1965 | Brick et al. | 117/107.1 |

*Primary Examiner*—Michael R. Lusignan
*Attorney, Agent, or Firm*—T. A. Zalenski; Gerald K. White

[57] ABSTRACT

Method and apparatus are provided for depositing a coating of uniform thickness across a substrate coated by a vapor-deposition process, for confining and directing the vapor to the substrate in a manner to minimize vapor loss, and for conveniently collecting vapor which bypasses the substrate.

5 Claims, 8 Drawing Figures

METHOD AND APPARATUS FOR VAPOR-DEPOSITING COATINGS ON SUBSTRATES

This is a continuation of application Ser. No. 80,305, filed Oct. 13, 1970, now abandoned.

This invention relates to the coating of substrates by vacuum vapor deposition, and, more particularly, to methods and apparatus for vacuum-vapor coating ferrous substrates with other metals, especially zinc.

In conventional processes for vapor coating a moving substrate, such as steel strip, the substrate is passed over a source of the coating material in a vacuum chamber. The coating material is contained within a crucible in a molten state and is heated sufficiently to vaporize. The generated vapors pass upwardly of the crucible and condense on the moving substrate to coat it.

One of the problems attendant these coating processes is that of providing a uniform coating thickness across the width of the substrate. Another problem encountered is that of vapor loss, that is, the bypassing of the substrate by the vapor and its subsequent condensation elsewhere within the vacuum chamber.

Accordingly, an object of the present invention is to provide a vapor-deposited coating of uniform thickness across the width of a substrate. Another object of the invention is to minimize vapor loss during the vapor-deposition coating of a substrate. Still another object of the invention is to provide for convenient collection of vapor which bypasses the substrate. Yet another object of the invention is to improve adhesion of the coating to the substrate by minimizing precoating of the substrate.

These and other objects and advantages of the invention will become more apparent from the following detailed description thereof with reference to the attached drawings wherein.

As indicated above, in coating a moving substrate by a conventional vapor-deposition process, the vapor tends to condense nonuniformly across the width of the substrate with the resulting coating being thicker at the center of the substrate than along its edges. Apparently, as the vapor rises within the crucible containing the coating material, the vapor immediately adjacent the side walls of the crucible experiences drag forces which tend to slow it down. At the same time the vapor in the center of the rising vapor stream is not subjected to these same forces and rises at a greater velocity, the velocity of the rising vapor gradually decreasing from the center of the stream to the side walls. In effect, the vapor rises in the crucible at varying velocities defined by a parabolic function in the same manner as laminar flow of fluids through a duct occurs. As a result, as the substrate passes over the crucible, vapor is delivered to the substrate at a rate corresponding to its rate of rise within the crucible.

Figure 2A:
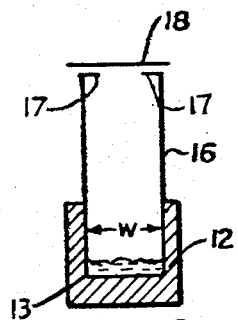
FIGS. 2a and 2b are diagrammatic illustrations of the coating systems used in collecting the data set out by the curves of FIG. 1.
Figure 2B:
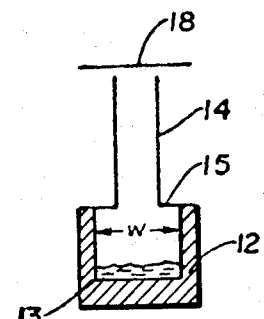
Figure 1:
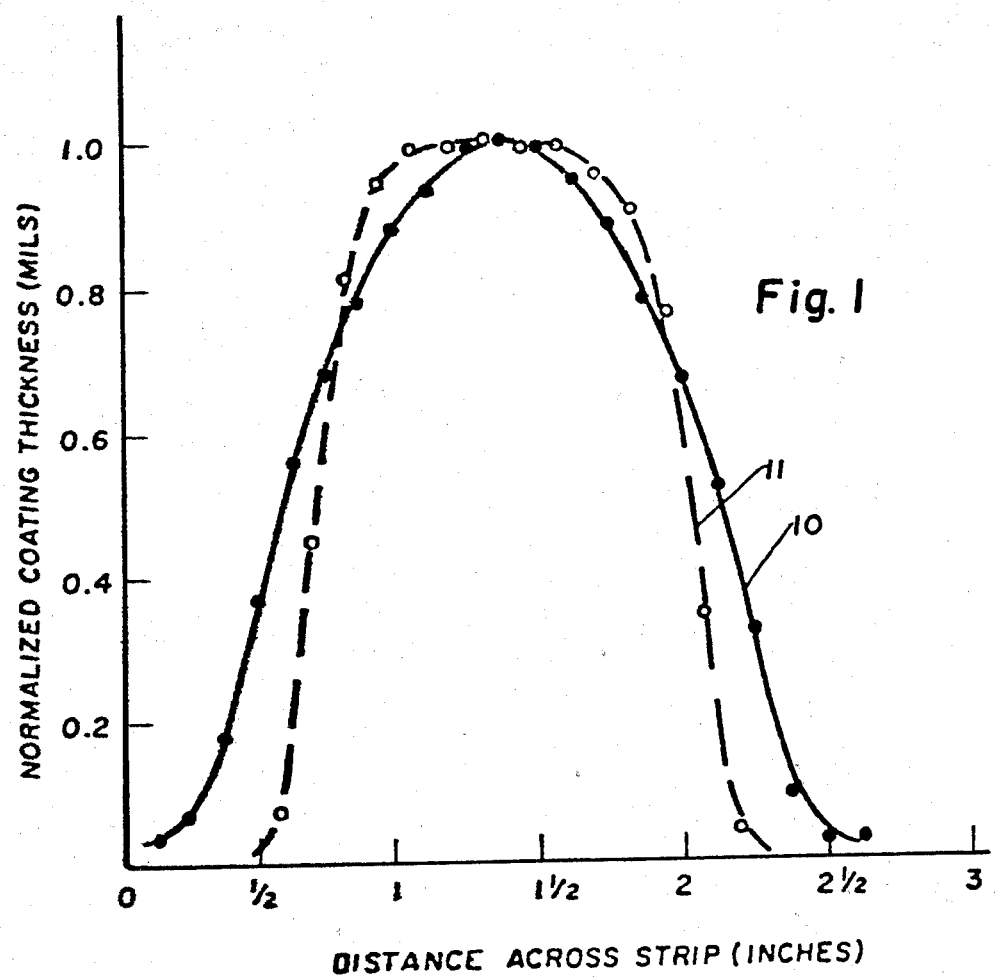
FIG. 1 is a graphical representation of zinc coating thickness profiles across the widths of steel strips coated according to two different vapor-deposition techniques, one of which employs certain teachings of the present invention.

In FIG. 1, curve 10 represents the coating-thickness profile across the width of a substrate resulting in a conventional vapor-deposition coating process as described. Curve 11 of FIG. 1 illustrates the coating-thickness profile across the width of a substrate wherein the source containing the coating material is constructed according to the teachings of the present invention. The data for curve 10 were obtained from a coating source of a type diagrammatically illustrated in FIG. 2b while the data for curve 11 were obtained from a coating source of a type diagrammatically illustrated in FIG. 2a. In both sources, a crucible 12 contained a pool of molten zinc 13. The width, W, of each crucible was three inches. In the source of FIG. 2b, an enclosing hood or chimney 14, of rectangular cross-section, was positioned above the crucible with closure means 15 closing off the open space 15 between the inside of the crucible and the outside of the hood. In the source of FIG. 2a, an enclosing hood or chimney 16, of rectangular cross-section was positioned above crucible 12. The inside cross-sectional dimensions of the crucible and hood 16 were the same. The hood 16 included coplanar blade-like shutters 17—17 extending along two opposite sides of the hood. In both sources, the hood height was four and one-half inches while the opening at the top of hood 14 was one and one-half inches wide as was the opening between shutters 17—17. A steel strip 18 was passed over each of the hoods one-fourth of an inch above the top of each hood in a direction transverse to the width, W, of the crucible. The crucibles were heated by resistance heaters to melt and vaporize the zinc contained therein. The hood walls were also heated to about 1000° F to prevent condensation of the zinc vapor thereon. In general, the temperature to which the hood walls must be heated to prevent condensation is dependent upon the zinc pressure inside the hood. The mass flow-rate of zinc through the top of the hoods in both systems was thirty-seven pounds per hour per square foot of hood opening.

As curve 10 illustrates, employing a source of the type shown in FIG. 2b or as described in U.S. Pat. No. 3,253,945, the zinc coating adjacent each edge of a substrate coated is very thin and gradually increases to a maximum near the center of the substrate. As illustrated by curve 11, the improvements obtained using the source of FIG. 2a are threefold. First, the vapor does not spread out over as large an area after it leaves the hood and is confined within a narrower band. Second, as illustrated by the steep sides of curve 11, the coating increases in thickness very rapidly from the edge of the coated area to the center of the strip. Third, the coating thickness is constant for a greater portion of the width, as illustrated by the flat top of curve 11. While we do not intend to be bound thereby, it is our belief that the improved coating profile obtained with the source of FIG. 2a results because of eddies that are set up below the blade-like shutters. These eddies break up any boundary layer which has formed from vapor flow up the hood walls and result in a more uniform vapor flow through the hood opening.

Figure 3:
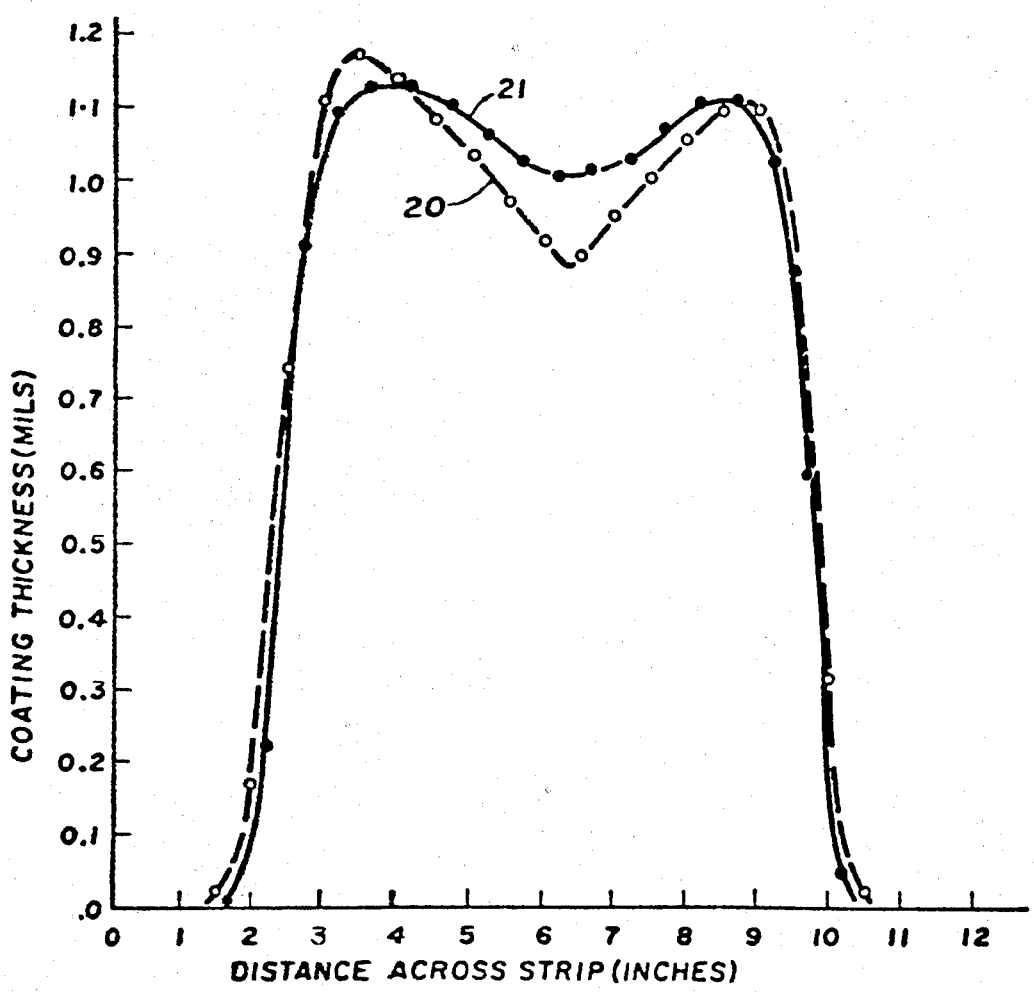
FIG. 3 is a graphical representation of zinc coating thickness profiles across the widths of steel strips for vapor-deposition coating processes carried out under different operating conditions.

In employing a source of the type illustrated in FIG. 2a, we have found that the distance between the top of the bath 13 and the shutters 17—17 can affect the coating thickness profile. The effect is illustrated in FIG. 3. Curves 20 and 21 illustrate that under conditions of relatively high vapor velocities, using a source of the type shown in FIG. 2a, shoulders are developed in the coating thickness profile, that is, the coating thickness adjacent each edge of the strip is greater than the coating thickness at the center of the strip. The difference in coating thickness between the top of the shoulders and the depression between the shoulders is a function of the ratio of the distance between the top of the molten bath within the crucible and the shutters at the top of the hood to the width, W, of the crucible. Increasing the ratio, results in a decrease of the shoulder height, that is, results in a more uniform coating-thickness profile. Curve 20 was obtained from a source where the height to width ratio was about 0.33 while curve 21 was obtained from a source where the ratio was about 1.33. Again, while we do not intend to be bound thereby, it is our belief that a relationship between the vapor flow in the eddies under the shutters and the extent of the boundary layer which forms adjacent to the hood walls is important in determining the height of the shoulders which occur in the coating thickness profile. The value of the height to width ratio appears to be a measure of the extent to which the boundary layers have formed in relationship to the source width. With well developed boundary layers, a small volume of vapor is redistributed by flow in the eddies and the excessive vapor flow near the shutters leading to shoulders in the profile is diminished. Ideally, the shoulder height of the profile curve should be zero. However, coating thickness profiles where the maximum deviation is within ± 10% of the average coating weight are quite acceptable. Such profiles, we have found, are obtained with height to width ratios of at least about one.

Figure 4:
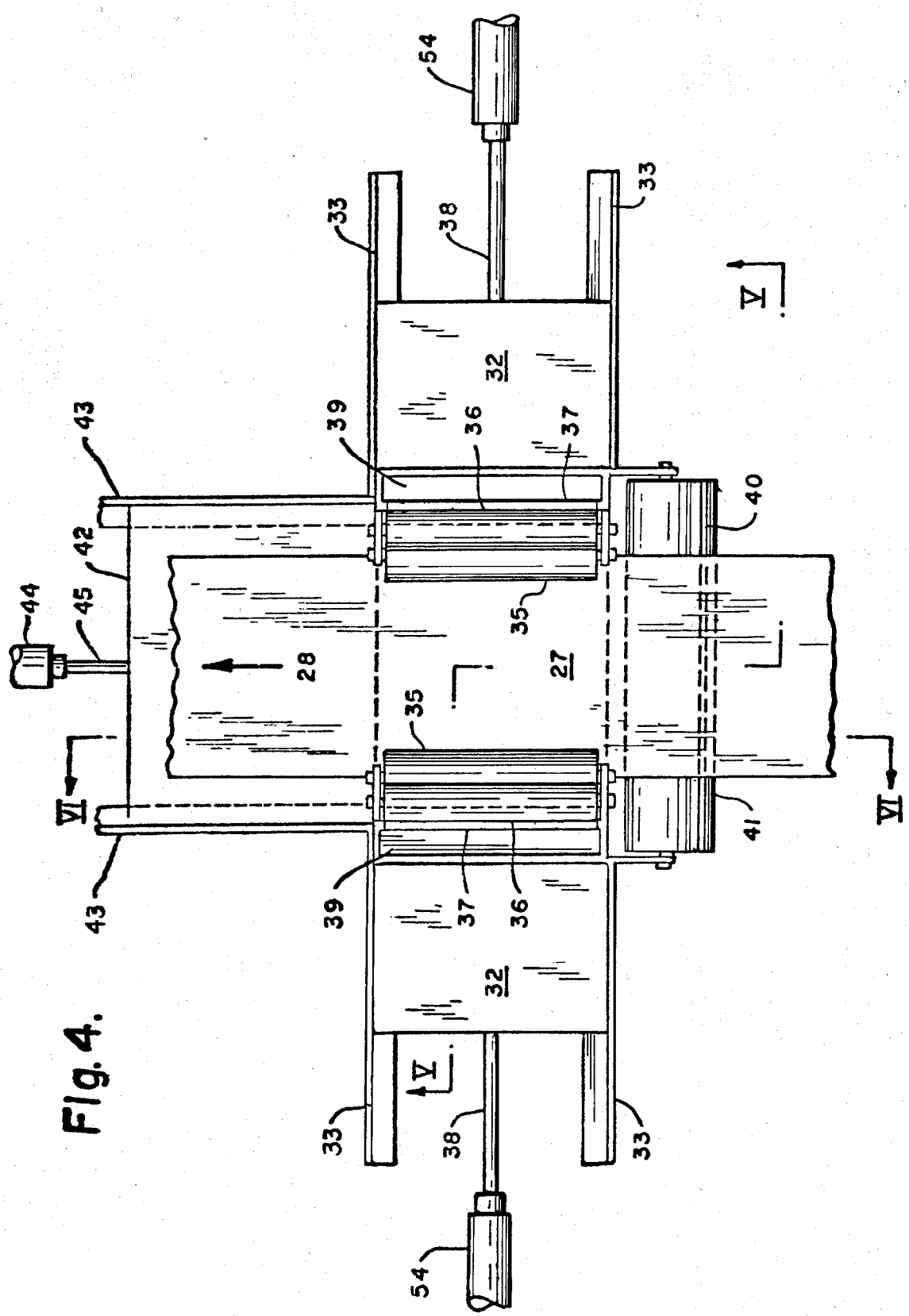
FIG. 4 is a plan view of apparatus according to the present invention.
Figure 5:
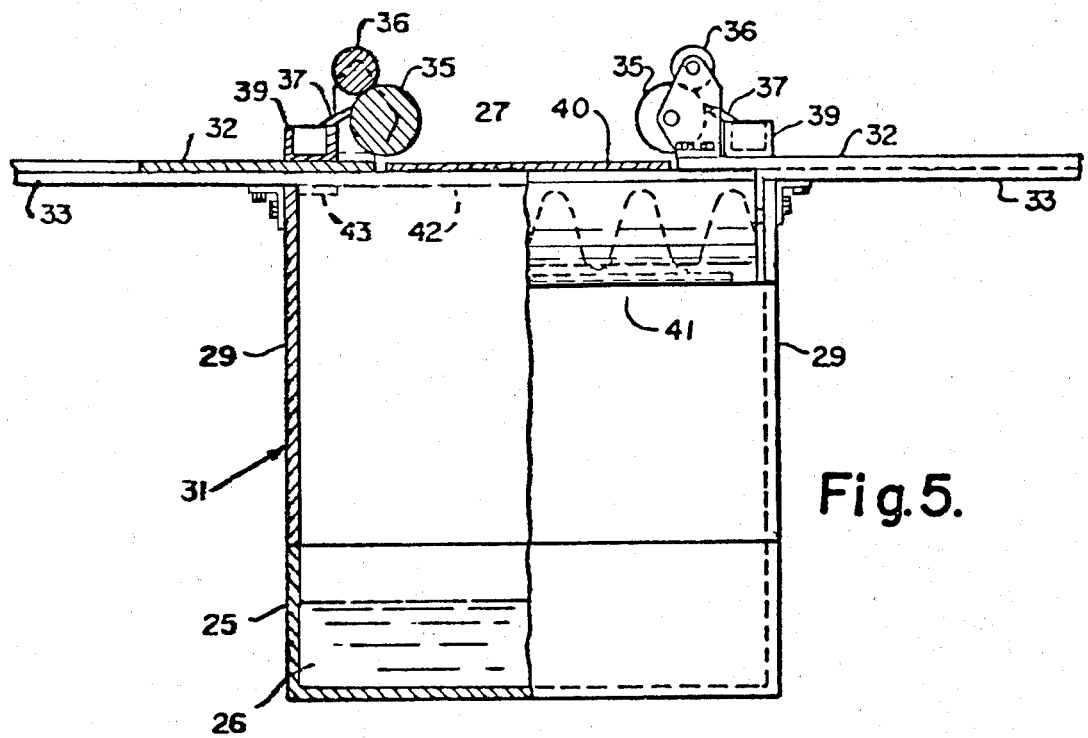
FIG. 5 is a vertical section through said apparatus taken along line 5—5 of FIG. 4.
Figure 6:
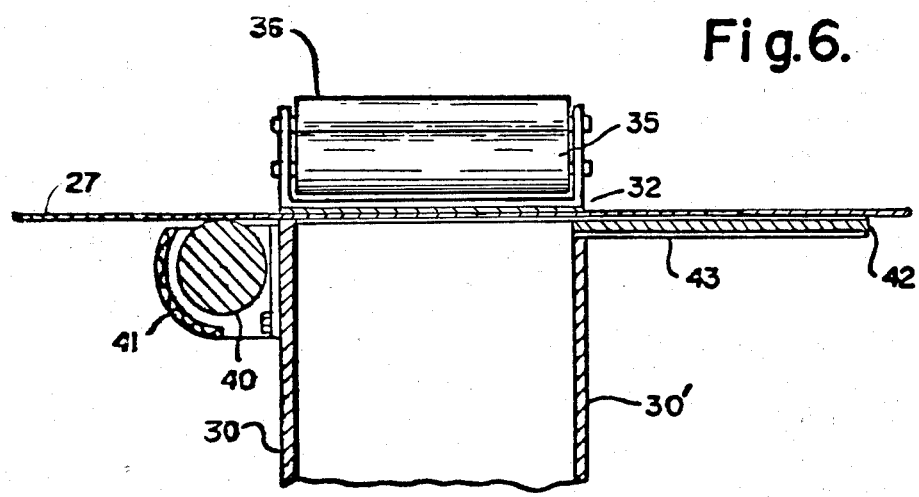
FIG. 6 is a vertical section through said apparatus taken along line 6—6 of FIG. 4.

Referring to FIGS. 4, 5 and 6, wherein is illustrated a presently preferred embodiment of the invention, a source means indicated generally at 31 includes a crucible 25 containing a coating material 26, such as zinc, to be vapor-deposited onto steel strip 27 which passes over the crucible in the direction of arrow 28, all within a vacuum chamber. The crucible is heated by a suitable heating means such as a resistance heater to vaporize the coating metal. The source means also includes a hood having vertical longitudinal side walls 29—29, a vertical front wall 30 and a vertical back wall 30′ extending upwardly of the crucible. Preferably, the hood is heated by means of heating tapes fastened to the walls of the hood or by any other suitable heating means.

Barrier means comprising blade-like shutter members 32—32 are positioned at the top of hood 31 and define a parallel-sided opening therebetween. The shutters extend along side walls 29—29 and are slidably seated on both the L-shaped supporting ledges 33—33 mounted on side walls 29—29 and the top of the hood 31. Strip 27 passes along the opening between the shutters, the edges of the strip being spaced from the shutter edges. Rods 38—38 of motor driven linear actuators 54—54 are connected to the back of the shutters. Operation of the actuators slidably positions the shutters along ledges —so that the opening between the shutters can be varied to accommodate varying strip widths and strip wandering.

Driven, water-cooled collector rolls 35—35 are mounted on shutters 32—32 and are positioned above the shutters and strip 27 along the gaps between the shutters and strip edges. Rolls 35—35 serve as subsidiary condensing means for condensing vapor bypassing strip 27 through the gaps. Breaker rolls 36—36 are in rotative engagement with collector rolls 35—35 and act to break-up the coating material condensed on the collector rolls. In addition, scraper blades 37—37 are in scraping engagement with the collector rolls to assist in removing condensed coating material therefrom. The breaker rolls and scraper blades thus serve as means for removing coating material removed from the collector rolls to collection boxes 39—39 mounted on the shutters.

In coating the strip 27, the coating material 26 contained within crucible 25 is heated so as to generate a vapor stream of the coating material. The vapor stream is directed upwardly through hood 31 which acts as a zone of confinement, confining the stream transversely of its upward direction. As the vapor stream reaches shutters 32—32, it is further confined transversely of its upward direction and parallel to the direction of travel of the strip 27 to pass through the opening between the shutters and condense on the strip. The shutters 32—32 are positioned along the top of hood 31 so as to be spaced from the edges of the strip. The gaps between the shutters and the edges of the strip are such that the vapor bypassing the strip through the gaps represents low-velocity vapor which, if condensed on the strip, accounts for the tailing portions on either side of the coating profile curve 21 of FIG. 3. Thus, by maintaining the width of the further confined vapor stream passing between shutters 32—32 greater than the width of the strip 27, and by maintaining the distance between the top of the coating material 26 and the strip at least about equal to the width of the hood or zone of confinement, a substantially uniform coating is deposited on the strip.

As the strip is coated, those portions of the further confined vapor stream which pass beyond the strip through the gaps between the shutters and strip edges condense on the rotating collector rolls 35—35. The condensed coating material is continuously removed from the rolls and deposited in collection boxes 39—39.

To preclude vapor loss through the space between the strip 27 and front wall 30, a roll 40 is mounted on front wall 30 for rotatively engaging the strip. Roll 40 is heated by radiant heater 41 to above the condensation temperature of the vapor and thereby prevents precoating of the strip by vapor flowing out of the hood 31 over the edge of front wall 30. Precoating of the strip adversely affects the adhesion of the coating subsequently deposited on the strip. The heated roll thus effectively seals off vapor flow from the source means to the outside.

It would be desirable to maintain a similar heated roll outside back wall 30′ but this cannot be done because such a heated roll in contact with the coated strip might cause localized melting of the coating. Accordingly, a heated secondary shutter 42 which acts, in effect, as an extension of the hood is slidably mounted on L-shaped supporting ledges 43—43 extending outwardly from the top of the hood in the direction of strip travel. The top of the secondary shutter is immediately adjacent the coated surface of the strip and thereby minimizes the escape of vapor therealong.

Although the secondary shutter functions as a shield to contain zinc vapor when it is in the open position, its major function is to close off the hood and prevent zinc coating of the strip during periods when transient conditions of vapor output occur, such as upon filling or emptying of the source or when the source is in a standby condition, or when an emergency strip stoppage is required. When these conditions exist, the primary shutters 32—32 along with the equipment mounted on the shutters are moved by actuators 54—54 to a fullopen position away from the strip edges. The secondary shutter then, under the influence of actuator 44 and rod 45 connected to the back of the shutter, is slidably driven along ledges 43—43 to close off the top of the hood. Rather than closing off the top of the hood completely, which we have found causes a zinc vapor pressure increase within the hood and crucible and eventual zinc leakage, the shutter closes only that portion of the hood underneath the tracking limits of the widest strip to be accommodated by the source. As can be seen in FIG. 5, the hood width is such that approximately two inch wide openings exist between the edges of the secondary shutter and the hood side walls 29 when the secondary shutter is in a closed position. However, when shutters 32—32 are in a full-open position, collector rolls 35—35 overhang the openings, and all of the zinc vapor generated during these transient conditions passes through the openings and is condensed on the collector rolls.

Figure 7:
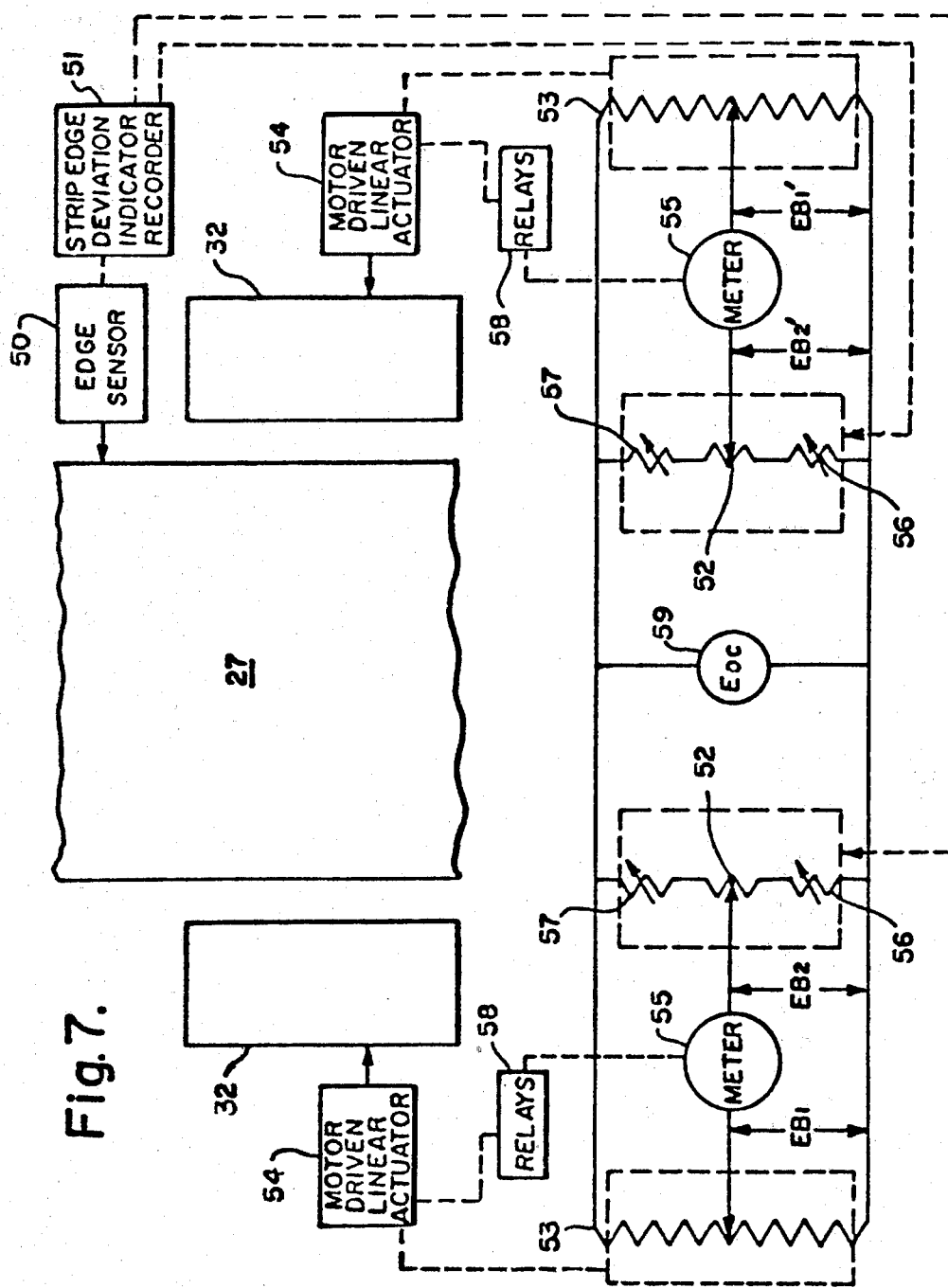
FIG. 7 is a schematic diagram of an automatic positioning means employed in the present invention.

During the coating operation, the strip may wander and not maintain a constant relationship with the edges of shutters 32—32. In addition, strips of different widths will be coated. Accordingly, as described, shutters 32—32 are movable and their positions automatically controlled by apparatus illustrated in FIG. 7. The apparatus includes means for sensing the location of an edge of the strip and developing an electrical signal measurably responsive thereto comprising edge sensor 50 in contact with the edge of the strip, and strip edge deviation indicator recorder 51. The deviation indicator recorder 51 monitors wandering of the strip about its center pass line, the recorder having a zero center scale. Strip position can be monitored by either contact or non-contacting sensor systems which feed into the recorder 51.

Attached to the recorder main slidewire balancing shaft are strip position potentiometers 52—52, eahc of which provides a strip position signal voltage. These potentiometers 52—52 are connected with opposing DC polarities; as the strip deviates from zero center pass line, the voltage level of one potentiometer decreases and the other increases an identical amount.

Means for developing a voltage measurably responsive to the position of shutters 32—32 comprise rotary potentiometers 53—53 which are driven by linear actuators 54—54 which control the positioning of the shutters. The values of resistors 56—56 and 57—57 are simultaneously adjusted to cause potentiometers 52—52 to assume a voltage level which provides a desired degree of offset between the shutter and strip edge. The linear actuators must then drive for balance of voltage EB1 with EB2 and voltage EB1' with EB2'. The value of each resistor 53 is equal to the sum of resistor values 56, 57 and 52 for each balancing circuit. Balance of voltage EB1 with EB2 and voltage EB1' with EB2' may be detected by zero center relay contact current meters 55—55 having separate adjustable relay actuation set points on either side of zero. The meter relays 58—58 drive the linear actuators to achieve balance. This balancing operation may also be performed by standard servo amplifier and servo motor drive of the linear actuator. The resistive balancing networks operate on electrical energy from DC voltage source 59.

We claim:

1. A process for coating a substrate comprising generating a vapor stream of coating material from a source of coating material, directing the vapor stream upwardly through a zone of confinement, confining the stream transversely about its upward direction in said zone of confinement, passing the substrate over said zone of confinement immediately adjacent the top thereof, further confining said vapor stream at the top of said zone of confinement transversely of its upward direction and parallel to the direction of travel of the substrate while maintaining the width of the further confined vapor stream greater than the width of the substrate and more narrow than the width of the confined vapor stream prior to said further confinement to the extent that low velocity components of the vapor stream do not condense on the substrate and thereby obtain a coating material thickness that is constant for a greater portion of its width than if the vapor stream were not further confined and a coating thickness profile characterized by a maximum deviation within ± 10% of its average coating weight, maintaining the distance between the source of coating material and the top of the zone of confinement at least about equal to the dimensional extent of the zone of confinement in the direction transverse to the direction of travel of the substrate, and condensing the further confined stream on said substrate.

2. The process of claim 1 including condensing those portions of the further confined vapor stream extending beyond the width of the substrate on a subsidiary condensing means.

3. The process of claim 2 including continuously removing from the subsidiary condensing means the material condensed thereon and transporting said material to a collecting means.

4. A process for coating a substrate comprising generating a vapor stream of coating material from a source of coating material, directing the vapor stream upwardly through a zone of confinement, confining the stream transversely about its upward direction in said zone of confinement, passing the substrate over said zone of confinement immediately adjacent the top thereof, further confining said vapor stream at the top of said zone of confinement transversely of its upward direction and parallel to the direction of travel of the substrate while maintaining the width of the further confined vapor stream greater than the width of the substrate, condensing the further confined stream on said substrate, and condensing those portions of the further confined vapor stream extending beyond the width of the substrate on a subsidiary condensing means.

5. The process of claim 4 including continuously removing from the subsidiary condensing means the material condensed thereon and transporting said material to a collecting means.

* * * * *